United States Patent
Frazier

(10) Patent No.: US 6,859,750 B1
(45) Date of Patent: Feb. 22, 2005

(54) RAMP SWEEP SYNTHESIS CONTROL

(75) Inventor: Brian Edward Frazier, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 79 days.

(21) Appl. No.: 10/366,429

(22) Filed: Feb. 13, 2003

(51) Int. Cl.[7] .............................................. G06F 19/00
(52) U.S. Cl. ........................................ 702/124; 702/117
(58) Field of Search ................................ 702/117, 119, 702/122, 123, 124, 57, 60, 61, 62, 63, 126, 189, 190; 324/76.26, 76.27, 602, 603, 604; 327/100, 306; 700/1, 11, 12, 14, 46; 710/1, 5, 100, 104; 712/1, 200, 214, 220, 225; 717/108, 116, 119

(56) References Cited

U.S. PATENT DOCUMENTS

| | | | | |
|---|---|---|---|---|
| 4,868,785 A | * | 9/1989 | Jordan et al. | 345/440 |
| 5,081,603 A | * | 1/1992 | Mikos | 708/271 |
| 5,086,504 A | * | 2/1992 | Nemeth-Johannes et al. | 717/143 |
| 5,283,900 A | * | 2/1994 | Frankel et al. | 718/100 |
| 5,392,448 A | * | 2/1995 | Frankel et al. | 712/35 |
| 5,826,072 A | * | 10/1998 | Knapp et al. | 712/226 |
| 6,108,717 A | * | 8/2000 | Kimura et al. | 710/8 |
| 6,292,849 B1 | * | 9/2001 | Kimura et al. | 710/8 |
| 6,304,922 B2 | * | 10/2001 | Kimura et al. | 710/8 |
| 6,484,124 B1 | * | 11/2002 | MacMullen | 702/182 |
| 6,525,522 B1 | * | 2/2003 | Pickerd | 324/76.58 |
| 6,646,428 B2 | * | 11/2003 | Fujita | 324/76.19 |
| 2002/0147854 A1 | | 10/2002 | Frazier et al. | |

OTHER PUBLICATIONS

Zhang, L; Yang, Z; Chen, S; Crow, M;"A PC–DSP–Based Unified Control System Design For Facts Devices"; IEEE Power Engineering Society Winter Meeting; vol. 1; Jan. 28, 2001; pp 252–257.*

Lepine, R; Martuscello, A; "A 0.5 to 20.0 GHZ RF Generator Instrument–On–A–Card Using MMIC and Field Programmable Gata Arrays"; IEEE Systems Readiness Technology Conference 'Advanced Mission Accomplishment', Conference Record; Sep. 17–21, 1990; pp 115–121.*

(List continued on next page.)

*Primary Examiner*—John Barlow
*Assistant Examiner*—Douglas N Washburn

(57) ABSTRACT

A signal generator produces a signal. The signal generator includes signal hardware that physically produces the signal and signal software that is used to control signal hardware. The signal software includes a higher level object and a plurality of lower level objects. The higher level object processes an instruction from a user to produce the signal such that the signal sweeps through a plurality of frequencies. The plurality of lower level objects serve as an interface between the higher level object and the signal hardware. At least one of the lower level objects communicates with the signal hardware and at least one of the lower objects communicates with the higher level object.

19 Claims, 4 Drawing Sheets

OTHER PUBLICATIONS

Vaks, V; Khodos, V; "High–Accuracy Bwo–Based High–Velocity Sweep Generator" 11th Intl'l Conf on Microwav and Telecommunication Technology; 2001; pp 564–565.*

Carey, T; Pratt, R; "A Modular Microwave Signal Generator for the 1990's and Beyond"; IEEE Systems Readiness Technology Conference 'Improved Systems Effectiveness in the Changing Environment of the 90s' Conf Rec; Sep. 24–26, 1991; pp 377–381.*

Rawnsley, D; Hummels, D; Segee, B; "A Virtual Instrument Bus Using Network Programming"; IEEE Instrumentation and Measurement Technology Conference 1997; vol 1; May 19–21, 1997; pp 694–697.*

Kraemer, W; "Ideal Calibration Source For Weather Radar Receivers"; News from Rohde and Schwarz; vol 4 No 172; 2001; pp 22–23.*

* cited by examiner

RAMP SWEEP SYNTHESIS CONTROL

BACKGROUND

The present invention concerns software control of hardware and pertains particularly to ramp sweep synthesis control.

A wide variety of systems include hardware that is controlled by software. The software used to control hardware is often referred to as firmware. Instruments such as those used in test and measurement applications have firmware to control circuits that generate test signals and/or obtain measurements.

For example, radio frequency (RF) and microwave signal sources typically include one or more control points that enable software to control a circuitry by writing values to the control points of the circuitry. The control points may be implemented as registers and/or digital-to-analog converters, etc. The circuitry includes, for example, filters, oscillators, frequency multipliers, frequency dividers, amplifiers and/or other hardware used for signal generation.

For different signal frequency ranges and/or signal amplifier ranges different firmware commands are required to assure that the hardware accurately generates signals. For example, when a signal generator performs a frequency sweep over a broad range of signal frequencies (e.g., 100 kilohertz (kHz) to 100 megahertz (MHz)) it may be necessary to adjust and/or change oscillators, frequency multipliers, frequency dividers and/or filters used to generate the signal. Firmware commands are used to control this process.

It is common to make hardware component changes to a system when performing support or upgrade operations on the system. Hardware component changes to a system may involve modification and/or replacement of existing components, and/or the addition of new components. Such hardware changes typically require modifications to the firmware that controls the components. However, making hardware component changes can require significant firmware revision which can be quite programmer intensive because of the complexity of firmware typically used to control the components.

SUMMARY OF THE INVENTION

In accordance with the preferred embodiment of the present invention, a signal generator produces a signal. The signal generator includes signal hardware that physically produces the signal and signal software that is used to control signal hardware. The signal software includes a higher level object and a plurality of lower level objects. The higher level object processes an instruction from a user to produce the signal such that the signal sweeps through a plurality of frequencies. The plurality of lower level objects serve as an interface between the higher level object and the signal hardware. At least one of the lower level objects communicates with the signal hardware and at least one of the lower objects communicates with the higher level object.

DESCRIPTION OF THE PREFERRED EMBODIMENT

Figure 1:
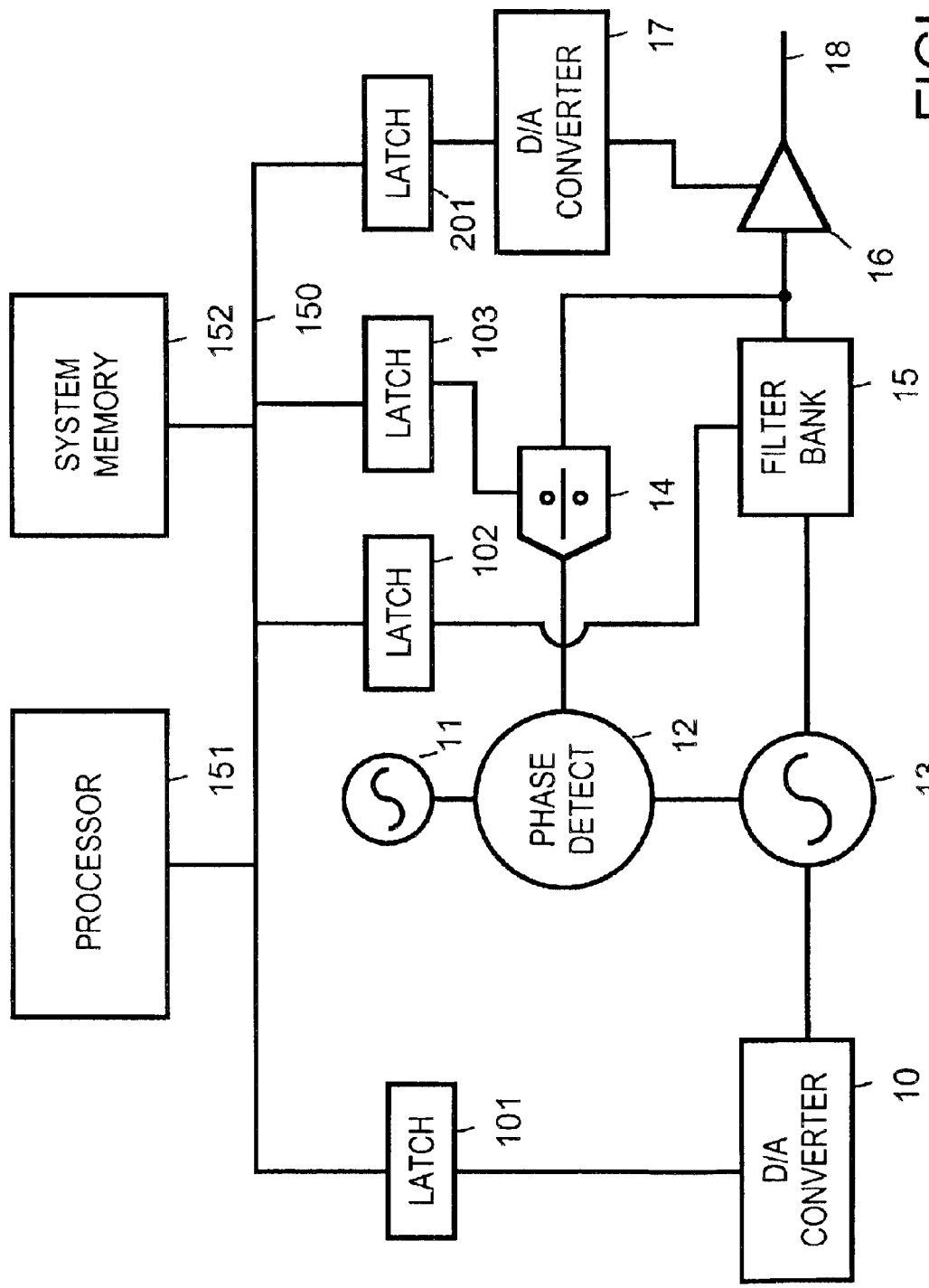
FIG. 1 is a simplified block diagram of signal generator hardware.

FIG. 1 is a simplified block diagram of signal generator hardware. The signal generator includes a 10 MHz reference 11, a 10 MHz to 100 MHz voltage controlled oscillator (VCO) 13 a filter bank 15, frequency multiplier/divider 14, a phase detector 12, and a power amplifier 16.

Based on a value in a latch 101, digital to analog (D/A) converter 10 controls VCO 13. The signal loop through VCO 13, filter bank 15, frequency multiplier/divider 14 and phase detect 12 operates as a phased locked loop that fine tunes the output of VCO 13.

Based on a value within latch 102, filter bank selects a filter to use in filtering a signal from VCO 13. For example, a first filter within filter bank 15 is used for signals in a frequency range between 10 MHz and 50 MHz, while, a second filter within filter bank 15 is used for signals in a frequency range between 50 MHz and 100 MHz.

Based on a value within latch 103, frequency multiplier/divider 14 selects frequency multiply circuitry or frequency divider circuitry to multiply or divide the frequency of the signal from filter bank 14.

Based on a value in a latch 201, digital to analog (D/A) converter 17 controls power amplifier 16 to control the amplitude of an output signal placed on circuit output 18.

A system processor 151, running firmware stored in system memory 152, writes information into latches 101, 102, 103 and 201 in order to control signal generation.

Figure 2:
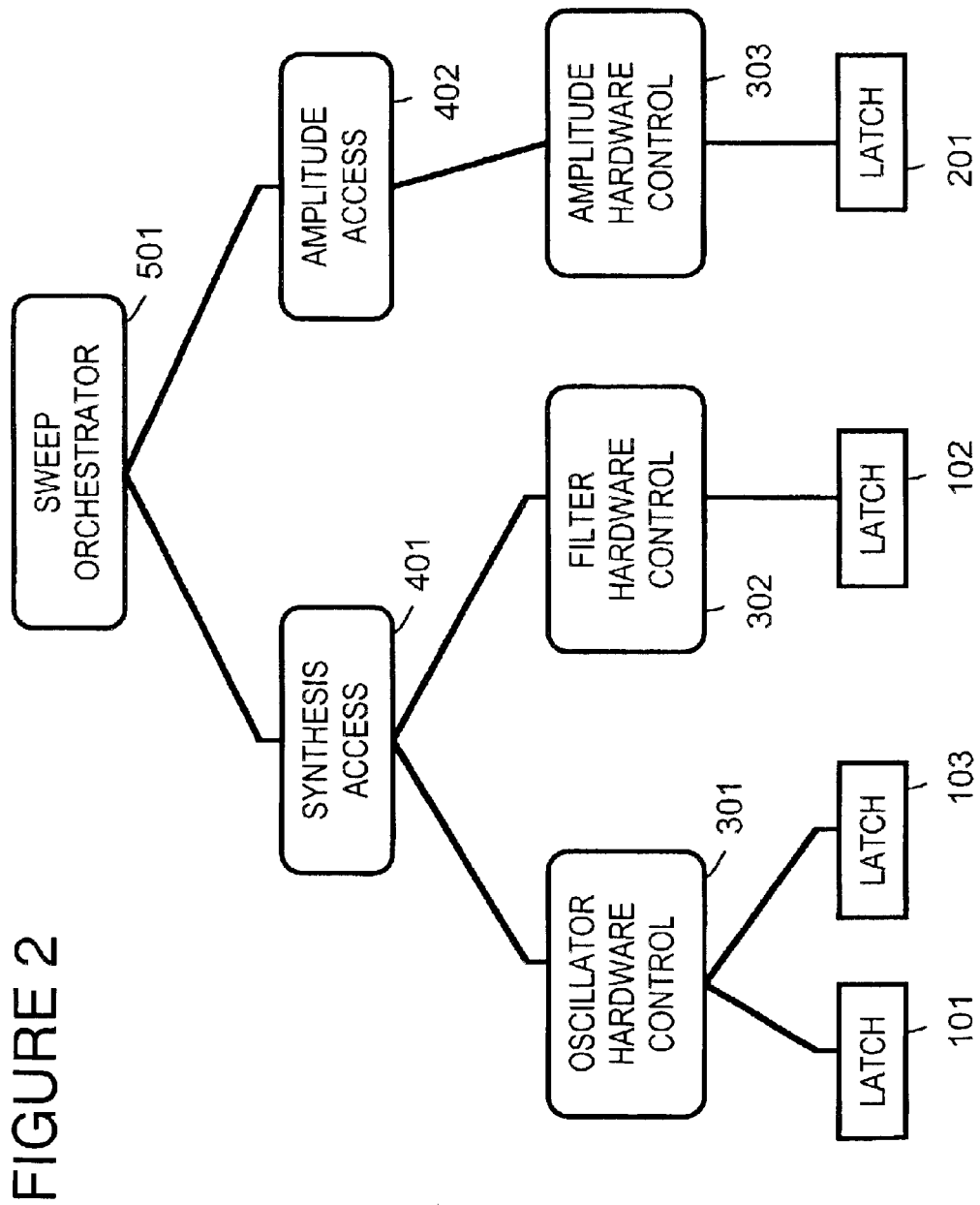
FIG. 2 represents object hierarchy within firmware used to control the signal generator hardware shown in FIG. 1, in accordance with a preferred embodiment of the present invention.

FIG. 2 represents an object hierarchy within the firmware stored in system memory 152 used to control the signal generator hardware shown in FIG. 1. An oscillator hardware control object 301 is used to control latch 101 and latch 103. A filter hardware control object 302 is used to control latch 102. An amplitude hardware control object 303 is used to control latch 201.

A synthesis access object 401 is used to control oscillator hardware control object 301 and filter hardware control object 302. An amplitude access object 402 is used to control amplitude hardware control object 303. A sweep orchestrator object 501 is used to control synthesis access object 401 and amplitude access object 402.

Sweep orchestrator object 501 is in an orchestration layer. Objects in the orchestration layer enable the implementation of high-level, feature-based algorithms in which there is little need for knowledge of the underlying hardware system.

Synthesis access object 401 and amplitude access object 402 are in an access layer. The access layer provides for encapsulation of hardware function circuits and enables implementation of control which is specific to the underlying circuitry. The access layer provides an application programming interface (API) to the underlying circuitry and enables use of the underlying circuit functionality without specific knowledge of the design of the underlying circuitry.

Oscillator hardware control object 301, filter hardware control object 302 and amplitude hardware control object 303 are within a hardware control layer. The hardware control layer is provided to abstract the specific digital interface to the underlying circuitry from the access layer.

The layered hierarchy allows for hardware modifications and replacements with minimum firmware code modifications. For example, minor changes to a portion of underlying circuitry may be made while not affecting the access layer. For example, the resolution of a control D/A converter (DAC) may be changed with a corresponding change to the code in the hardware control layer while not affecting the code in the access layer. Major changes to a portion of underlying circuitry may affect the access layer, but not require changes to the orchestration layer.

When a user requests a ramp sweep, sweep orchestrator object 501 communicates with synthesis access object 401 and amplitude access object 402, querying for the frequency stopping points synthesis access object 401 requires within the requested sweep span. Sweep orchestrator object 501 builds up a dynamic list of points that is a composite of the frequency stopping points. When there are multiple frequency stopping points in the list, the algorithm splits up the requested sweep into segments that are divided at the frequency points in the dynamically generated list.

When the sweep is started, sweep orchestrator object 501 sweeps until a next frequency stopping point in the dynamic list is encountered. At each frequency stopping point, the necessary commands are given to update the hardware in preparation to continue the sweep to the next frequency stopping point. Each segment is swept, then the hardware associated with the requested frequency stopping points is updated.

In a preferred embodiment of the present invention, sweep orchestrator object 501 has the ability to consult a separate flexible band-crossing list. This enables sweep orchestrator object 501 to know when to ignore a frequency switch point returned by an access object. The benefit of this is that if the switch point is too close to the start or stop frequency of the sweep, then the point can be ignored so that the sweep is more time efficient for the user without degrading performance.

Table 1 below sets out C++ programming language pseudo code that defines objects used to implement sweep orchestrator object 501, synthesis access object 401 and amplitude access object 402.

TABLE 1

```
Struct List {
    Array of frequencies:
    One to one list of access object to frequency array;
}
Class Sweep_Orchestrator {
    Sweep_Orchestrator( . . . ); // Constructor
    ~Sweep_Orchestrator( . . . ); // Destructor
    Sweep_frequency_range(double start_frequency,
    double stop_frequency);
    Sweep_update_hardware_finished( );
    Synthesis Access *synth_access;
    Amplitude-Access *ampl_access;
List sweep_frequency_point;
};
Class Synthesis-Access {
    Synthesis_Access( . . . ); // Constructor
    ~Synthesis_Access( . . . ); // Destructor
    Query_next_lowest_frequency(double current_frequency);
    Set_next_frequency(double new_frequency);
    Start_oscillator_sweep(double start_frequency,
    double stop_frequency);
}
```

TABLE 1-continued

```
Class Amplitude Access {
    Amplitude_Access( . . . ); // Constructor
    ~Amplitude_Access( . . . ); // Destructor
};
Query_next_lowest_frequency(double current-frequency);
Set_next_frequency(double new frequency);
};
```

Figure 3:
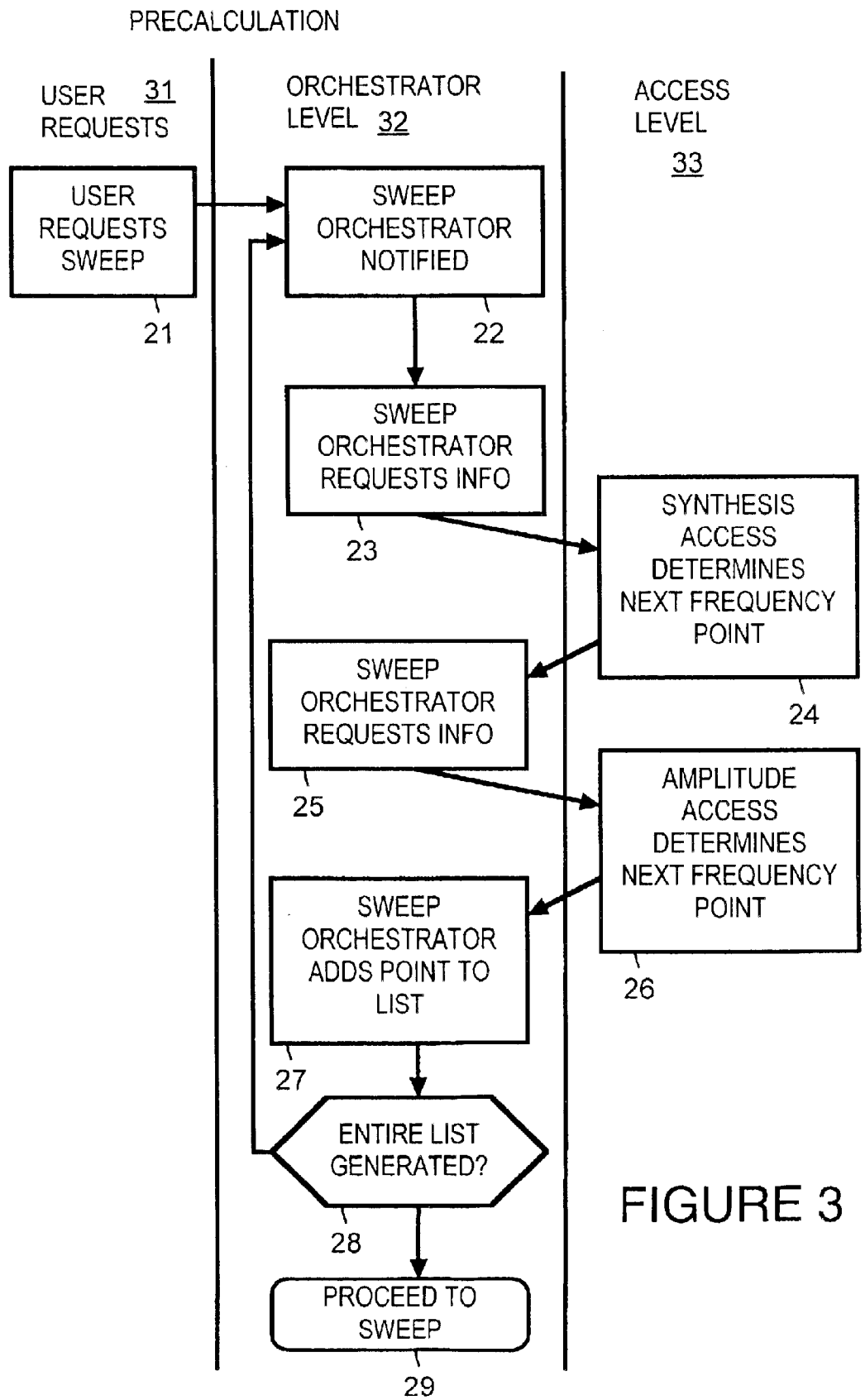
FIG. 3 is an algorithmic execution flowchart that illustrates setup of a sweep operation for performance by the signal generator hardware shown in FIG. 1, in accordance with a preferred embodiment of the present invention.

FIG. 3 is a simplified algorithmic execution flowchart that illustrates setup of a sweep operation for performance by the signal generator hardware shown in FIG. 1. In a column 31, user requests are listed. In a column 32, actions taken at the orchestrator level are listed. In a column 33, actions taken at the access level are listed.

In a block 21, a user requests a sweep. For example, the user requested sweep is from 15 MHz to 80 MHz. Sweep orchestrator object 501 (shown in FIG. 2) receives the sweep request in a block 22.

In a block 23, sweep orchestrator object 501 requests information from synthesis access object 401. In a block 24, synthesis access object 401 responds with a value of 50 MHz. The value of 50 MHz corresponds to a frequency stopping point at which, for example, filter bank 15 (shown in FIG. 1) needs to switch a filter. In a block 25, sweep orchestrator object 501 requests information from amplitude access object 402. In a block 26, amplitude access object 402 responds with a value of 60 MHz. The value of 60 MHz corresponds, for example, to a frequency point at which latch 201 (shown in FIG. 1) needs updating.

In a block 27, sweep orchestrator object 501 evaluates the information returned from synthesis access object 401 and amplitude access object 402 and determines that the next lowest frequency stopping point must be 50 MHz. It adds that frequency stopping point to a dynamic list of points and associates that frequency stopping point with synthesis access object 401.

In a block 28, sweep orchestrator determines whether all frequency stopping points received in the pass are above the highest (stop) frequency in the sweep. Since 50 MHz is less than the stop frequency, sweep orchestrator object 501 loops, returning to block 22.

In block 23, sweep orchestrator object 501 requests information from synthesis access object 401. In block 24, synthesis access object 401 responds with a value of 100 MHz. In block 25, sweep orchestrator object 501 requests information from amplitude access object 402. In block 26, amplitude access object 402 again responds with a value of 60 MHz.

In block 27, sweep orchestrator object 501 evaluates the information returned from synthesis access object 401 and amplitude access object 402 and determines that the next lowest frequency stopping point is 60 MHz. It adds that frequency stopping point to a dynamic list of points and associates that frequency stopping point with amplitude access object 402.

In block 28, sweep orchestrator object 501 determines whether all frequency stopping points received in the pass are above the stop frequency in the sweep. Since 60 MHz is less than the stop frequency, sweep orchestrator object 501 loops, returning to block 22.

In block 23, sweep orchestrator object 501 requests information from synthesis access object 401. In block 24, synthesis access object 401 again responds with a value of 100 MHz. In block 25, sweep orchestrator object 501 requests information from amplitude access object 402. In block 26, amplitude access object 402 responds with a value of 125 MHz.

In block 27, sweep orchestrator object 501 evaluates the information returned from synthesis access object 401 and amplitude access object 402 and determines that there is no stopping frequency below the sweep stop frequency of 80 MHz.

In block 28, sweep orchestrator object 501 determines that all frequency stopping points received in the pass are above the stop frequency of 80 MHz. In a block 29, sweep orchestrator object 501 proceeds with executing the sweep.

Table 2 below sets out C++ programming language pseudo code within sweep orchestrator object 501, that implements setup of a sweep operation.

loads a value into latch 101. In a block DAC 10 responds to the value in latch 101 by causing VCO 13 to start the sweep segment from 15 MHz to 50 MHz. Upon VCO 13 completing the first sweep segment, the hardware, as indicated by a block 57, notifies sweep orchestrator object 501 that the first sweep segment has been completed.

In a block 58, sweep orchestrator object 501 sets up the second sweep segment. As indicated by block 59, this includes synthesis access object 55 signaling filter bank 15, through latch 102, to change filters. As indicated by block 60, filter bank 15 responds to the value placed in latch 102 by changing filters. Upon the filter being changed, the second segment is swept from 50 MHz to 60 MHz.

Upon VCO 13 completing the second sweep segment, the hardware, as indicated by a block 61, notifies sweep orches-

TABLE 2

```
Sweep_frequency_range(double start_frequency, double stop_frequency)
{
   sweep_start_frequency = start_frequency;
   sweep_stop_frequency = stop_frequency;
   current_frequency = start_frequency;
   while(current_frequency < stop_frequency)
   {
      temp_freq1 = synth_access->Query_next_lowest_frequency(current_frequency);
      temp_freq2 = ampl access->Query_next_lowest_frequency(current_frequency);
      if(temp_freq1 <temp_freq2 and temp_freq1 <stop_frequency)
      {
         Add entry to sweep_frequency_point list with temp_freq1 and synth_access;
         current frequency = temp_freq1 + 1;
      }
      else if(temp_freq1 == temp_freq2 and temp_freq1 <stop_frequency)
      {
         Add entry to sweep_frequency_point list with temp_freq1 and synth_access;
         Add entry to sweep_frequency_point list with temp_freq2 and ampl_access;
         current frequency = temp_freq1 + 1;}else if(temp_freq2 <stop_frequency)
      }
else if(temp_freq2<stop_frequency)
      {
         Add entry to sweep_frequency_point list with temp_freq2 and ampl_access;
         current_frequency temp_freq2 + 1;
      }
      else
      {
         current_frequency = stop_frequency;
      }
   }
   Set hardware for beginning sweep frequency;
   current_frequency = first_segment_stop_frequency;
synth_access-> Start_oscillator_sweep(start_frequency,
first_segment_stop_frequency);
}
```

Figure 4:
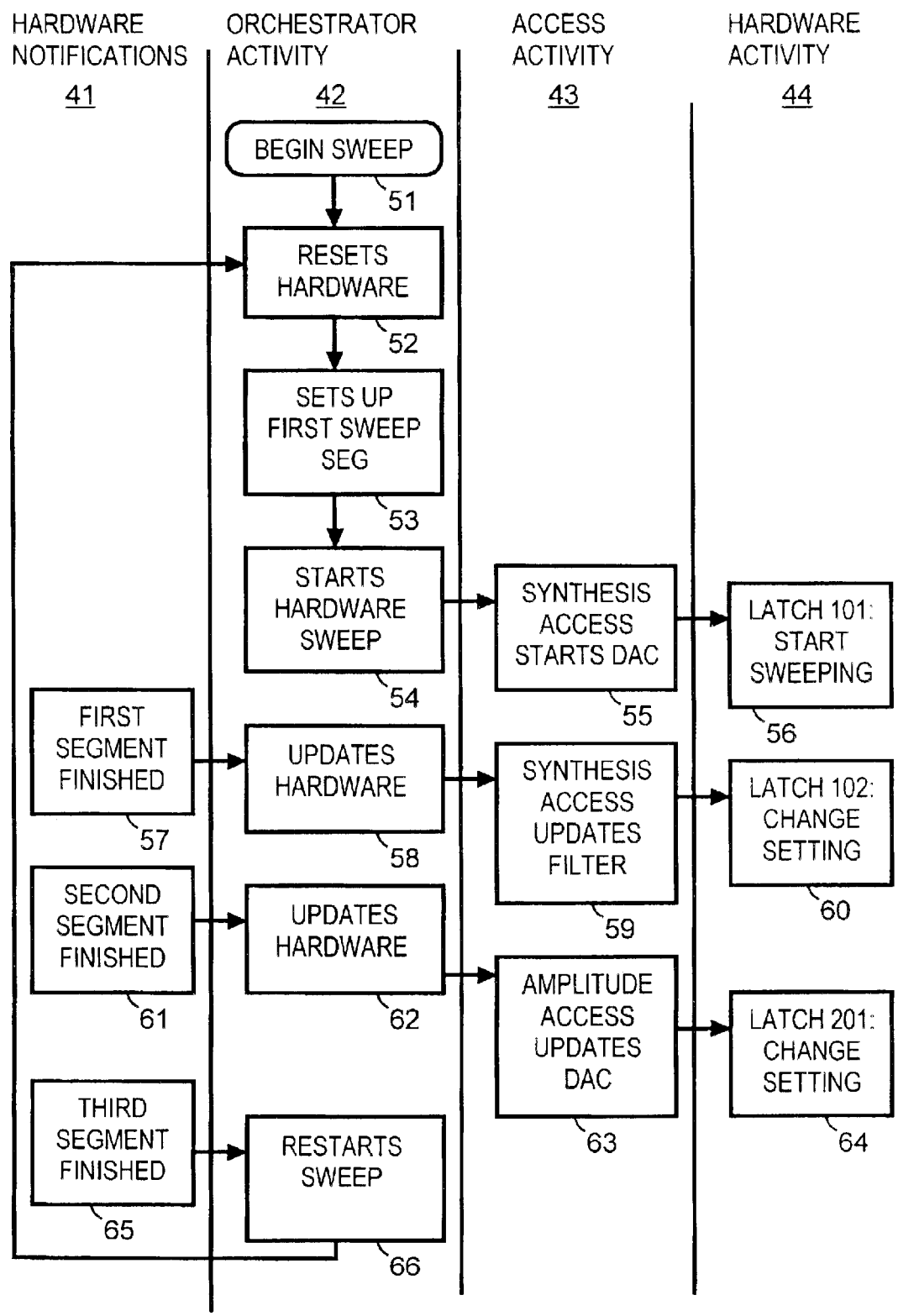
FIG. 4 is an algorithmic execution flowchart that illustrates execution of a sweep operation performed by the signal generator hardware shown in FIG. 1, in accordance with a preferred embodiment of the present invention.

FIG. 4 is a simplified algorithmic execution flowchart that illustrates performance of the sweep operation set up according the example illustrated by FIG. 3. In a column 41, hardware notifications are listed. In a column 42, actions taken at the orchestrator level are listed. In a column 43, actions taken at the access level are listed. In a column 44, actions taken at the hardware level are listed.

In a block 51, sweep orchestrator object 501 begins the sweep. In a block 52, sweep orchestrator object 501 resets the signal generator hardware. For example, sweep orchestrator object 501 sends commands to the access level requesting the hardware be reset to a sweep start frequency of 15 MHz, which is the start frequency of the first sweep segment. In a block 53, sweep orchestrator object 501 finishes setting up the first sweep segment where the frequency stopping point of 50 MHz.

In a block 55, sweep orchestrator object 501 instructs synthesis access object 401 to start D/A converter (DAC) 10 (shown in FIG. 1). In a block 55, synthesis access object 401 trator object 501 that the second sweep segment has been completed.

In a block 62, sweep orchestrator object 501 sets up the third sweep segment. As indicated by block 63, this includes amplitude access object 55, through latch 102, signaling DAC 17 to change amplitude of power amplifier 16. As indicated by block 64, DAC 17 responds to the value placed in latch 102 by changing the setting of power amplifier 16. Upon the setting being changed, the third segment is swept from 60 MHz to 80 MHz.

Upon VCO 13 completing the third sweep segment, the hardware, as indicated by a block 65, notifies sweep orchestrator object 501 that the second sweep segment is finished. In a block 66, sweep orchestrator object 501 restarts the sweep.

Table 3 below sets out C++ programming language pseudo code within sweep orchestrator object 501, that implements performance of a sweep operation.

TABLE 3

```
Sweep_update_hardware_finished( )
{
  if(current_frequency >= last frequency point in sweep_frequency_point_list)
  {
    Set hardware for beginning sweep frequency;
    current-frequency = sweep_start_frequency;
synth_access-> Start_oscillator_sweep(start_frequency,
      first_segment_stop_frequency);
  }
  else
  {
    temp_start_frequency = current_frequency;
    current-frequency = next point in sweep_frequency_point list that is >
      temp_start_frequency;
    if(current frequency is associated with synth_access in sweep_frequency_point list)
      synth_access->Set_next_frequency(temp_start_frequency);
    if(current_frequency is associated with ampl_access is sweep_frequency_point list)
      ampl_access->Set_next_frequency(temp_start_frequency);
    synth_access->Start_oscillator_sweep(temp_start_frequency, current_frequency);
  }
}
```

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A signal generator that produces a signal, the signal generator comprising:

signal hardware that produces the signal; and, signal software that is used to control the signal hardware, the signal software comprising:

a higher level object that processes an instruction from a user to produce the signal such that the signal sweeps through a plurality of frequencies, and a plurality of lower level objects that serve as an interface between the higher level object and the signal hardware, at least one of the lower level objects communicating with the signal hardware and at least one of the lower level objects communicating with the higher level object.

2. A signal generator as in claim 1 wherein the plurality of lower level objects include:

a synthesis access object to which the higher level object issues commands pertaining to signal frequency of the signal; and, an amplitude access object to which the higher level object issues commands pertaining to amplitude of the signal.

3. A signal generator as in claim 1 wherein the plurality of lower level objects include:

an oscillator hardware control object that controls oscillator frequency within the signal hardware;

a filter hardware control object that controls filter selection within the signal hardware; and, an amplitude hardware control object that controls amplifier amplitude within the signal hardware.

4. A signal generator as in claim 1 wherein the plurality of lower level objects include:

a synthesis access object to which the higher level object issues commands pertaining to signal frequency of the signal;

an amplitude access object to which the higher level object issues commands pertaining to amplitude of the signal;

an oscillator hardware control object that controls oscillator frequency within the signal hardware;

a filter hardware control object that controls filter selection within the signal hardware; and, an amplitude hardware control object that controls amplifier amplitude within the signal hardware.

5. A signal generator as in claim 1 wherein the higher level object is a sweep orchestrator object.

6. A storage device that stores software which, when executed by a processing device interacts with signal hardware that produces a signal, the software, when executed, comprising:

a higher level object that processes an instruction from a user to produce the signal such that the signal sweeps through a plurality of frequencies; and, a plurality of lower level objects that serve as an interface between the higher level object and the signal hardware, at least one of the lower level objects communicating with the signal hardware and at least one of the lower level objects communicating with the higher level object.

7. A storage device as in claim 6 wherein the plurality of lower level objects include:

a synthesis access object to which the higher level object issues commands pertaining to signal frequency of the signal; and, an amplitude access object to which the higher level object issues commands pertaining to amplitude of the signal.

8. A storage device as in claim 6 wherein the plurality of lower level objects include:

an oscillator hardware control object that controls oscillator frequency within the signal hardware;

a filter hardware control object that controls filter selection within the signal hardware; and, an amplitude hardware control object that controls amplifier amplitude within the signal hardware.

9. A storage device as in claim 6 wherein the plurality of lower level objects include:

a synthesis access object to which the higher level object issues commands pertaining to signal frequency of the signal;

an amplitude access object to which the higher level object issues commands pertaining to amplitude of the signal;

an oscillator hardware control object that controls oscillator frequency within the signal hardware;

a filter hardware control object that controls filter selection within the signal hardware; and, an amplitude hardware control object that controls amplifier amplitude within the signal hardware.

10. A storage device as in claim 6 wherein the higher level object is a sweep orchestrator object.

11. A method for producing a signal, method comprising:

(a) processing, by a higher level object, an instruction from a user to produce the signal such that the signal sweeps through a plurality of frequencies; and, (b) using a plurality of lower level objects as an interface between the higher level object and signal hardware that produces the signal, at least one of the lower level objects communicating with the signal hardware and at least one of the lower level objects communicating with the higher level object.

12. A signal generator as in claim 11 wherein step (b) includes:

issuing, by the higher level object to a synthesis access object, commands pertaining to signal frequency of the signal; and, issuing, by the higher level object to an amplitude access object, commands pertaining to amplitude of the signal.

13. A signal generator as in claim 11 wherein step (b) includes:

controlling, by an oscillator hardware control object, oscillator frequency within the signal hardware;

controlling, by a filter hardware control object, filter selection within the signal hardware; and, controlling, by an amplitude hardware control object, amplitude within the signal hardware.

14. A signal generator as in claim 11 wherein step (b) includes:

issuing, by the higher level object to a synthesis access object, commands pertaining to signal frequency of the signal;

issuing, by the higher level object to an amplitude access object, commands pertaining to amplitude of the signal;

controlling, by an oscillator hardware control object, oscillator frequency within the signal hardware;

controlling, by a filter hardware control object, filter selection within the signal hardware; and, controlling, by an amplitude hardware control object, amplitude within the signal hardware.

15. A signal generator control that controls signal hardware to produce a signal, the signal generator control comprising:

higher level means for processing an instruction from a user to produce the signal such that the signal sweeps through a plurality of frequencies, and a plurality of lower level means for serving as an interface between the higher level means and the signal hardware, at least one of the lower level means communicating with the signal hardware and at least one of the lower level means communicating with the higher level means.

16. A signal generator control as in claim 15 wherein the plurality of lower level means includes:

synthesis access means for receiving from the higher level means commands pertaining to signal frequency of the signal; and, amplitude access means for receiving from the higher level means commands pertaining to amplitude of the signal.

17. A signal generator control as in claim 15 wherein the plurality of lower level means includes:

oscillator hardware control means for controlling oscillator frequency within the signal hardware;

filter hardware control means for controlling filter selection within the signal hardware; and, amplitude hardware control means for controlling amplifier amplitude within the signal hardware.

18. A signal generator control as in claim 15 wherein the plurality of lower level means includes:

synthesis access means for receiving from the higher level means commands pertaining to signal frequency of the signal;

amplitude access means for receiving from the higher level means commands pertaining to amplitude of the signal;

oscillator hardware control means for controlling oscillator frequency within the signal hardware;

filter hardware control means for controlling filter selection within the signal hardware; and, amplitude hardware control means for controlling amplifier amplitude within the signal hardware.

19. A signal generator as in claim 15 wherein the higher level means is a sweep orchestrator object.

\* \* \* \* \*